(12) United States Patent
Yamaguchi et al.

(10) Patent No.: US 6,441,450 B1
(45) Date of Patent: Aug. 27, 2002

(54) ACCELERATION SENSOR AND METHOD OF MANUFACTURING THE SAME

(75) Inventors: Yasuo Yamaguchi, Tokyo (JP); Kunihiro Nakamura, Tokyo (JP); Shiro Yamasaki, Tokyo (JP); Teruya Fukaura, Hyogo (JP)

(73) Assignees: Mitsubishi Denki Kabushiki Kaisha, Tokyo (JP); Mitsubishi Electric Engineering Company Limited, Tokyo (JP); Ryoden Semiconductor System Engineering Corporation, Itami (JP)

( * ) Notice: Subject to any disclaimer, the term of this patent is extended or adjusted under 35 U.S.C. 154(b) by 0 days.

(21) Appl. No.: 09/832,896

(22) Filed: Apr. 12, 2001

(30) Foreign Application Priority Data

Oct. 20, 2000 (JP) ........................................ 2000-321140

(51) Int. Cl.[7] .............................................. H01L 29/84
(52) U.S. Cl. ........................................ 257/417; 257/419
(58) Field of Search ........................... 257/415, 417–419

(56) References Cited

U.S. PATENT DOCUMENTS

| | | | | |
|---|---|---|---|---|
| 5,121,180 A | * | 6/1992 | Beringhause et al. | ........ 257/417 |
| 6,316,840 B1 | * | 11/2001 | Otani | .......................... 257/787 |

* cited by examiner

*Primary Examiner*—Gene M. Munson
(74) *Attorney, Agent, or Firm*—Oblon, Spivak, McClelland, Maier & Neustadt, P.C.

(57) ABSTRACT

Providing an acceleration sensor in which a base portion and a cap portion are bonded to each other and a sensor portion is sealed off between these two, and which has an improved bonding strength between the base portion and the cap portion. A sensor portion and a frame portion surrounding a periphery of the sensor portion are disposed on a semiconductor substrate. A base portion is comprised, where a diffusion preventing layer and a non-doped polycrystalline silicon layer are stacked one atop the other on the frame portion. A cap portion is comprised, where a nickel layer is formed on a base unit. The non-doped polycrystalline silicon layer of the base portion and the nickel layer of the cap portion are bonded to each other by eutectic bonding.

16 Claims, 2 Drawing Sheets

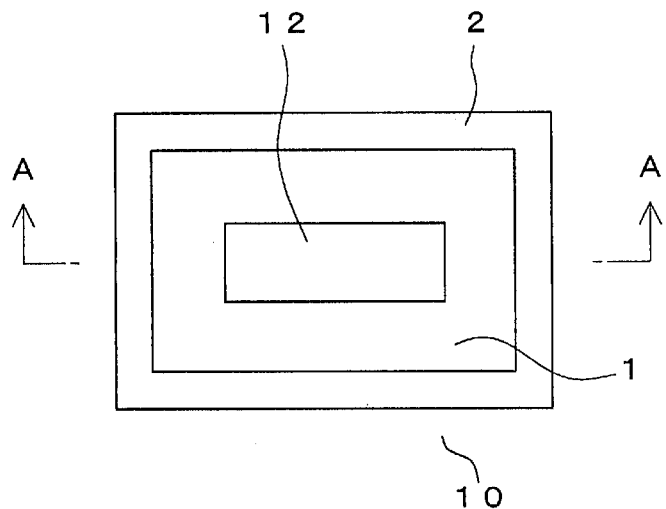
Fig.3 PRIOR ART
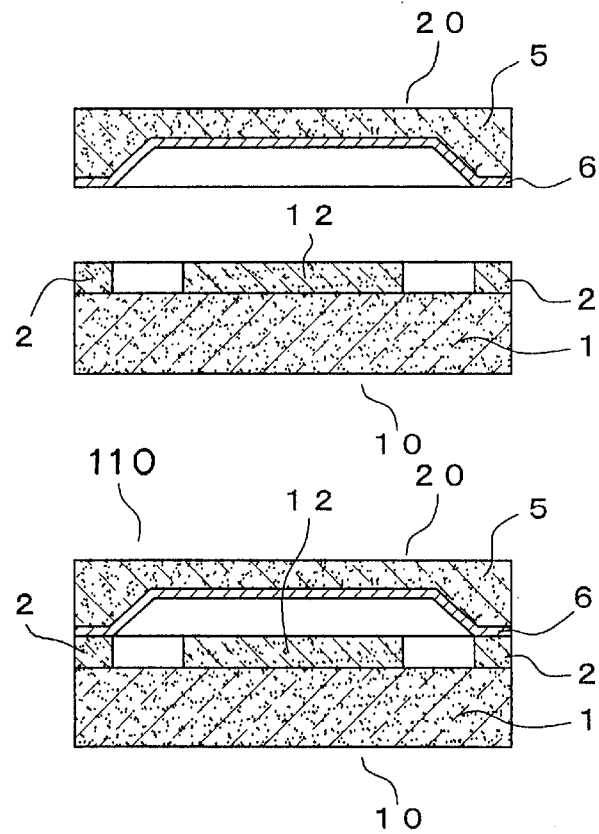
Fig.4A PRIOR ART
Fig.4B PRIOR ART

ACCELERATION SENSOR AND METHOD OF MANUFACTURING THE SAME

BACKGROUND OF THE INVENTION

The present invention relates to an acceleration sensor and a method of manufacturing the same, and more particularly, a capacitive acceleration sensor in which a sensor element is sealed off and a method of manufacturing the same.

FIGS. 3, 4A and 4B show steps of manufacturing a conventional capacitive acceleration sensor. First, as shown in FIG. 3, a polycrystalline silicon layer doped with phosphorus is deposited on a silicon semiconductor substrate 1. Next, the polycrystalline silicon layer is selectively removed, thereby forming a sensor portion 12 and a frame portion 2. In the sensor portion 12, an acceleration sensor element (not shown) is formed using a conventional method. At this step, a base portion 10 of the acceleration sensor is completed.

Next, as shown in FIG. 4A, a cap portion 20 for covering the sensor portion 12 of the base portion 10 is prepared. FIG. 4A is a cross sectional view along lines A—A in FIG. 3. At the step of preparing the cap portion 20, first, a concave portion is formed in one surface of a silicon substrate, and a cap main unit 5 is accordingly formed. Next, a metallic layer 6 is formed so as to coat the surface of the cap main unit 5 including the concave portion. The metallic layer 6 is obtained by vapor depositing a titanium layer on the cap main unit 5 and thereafter vapor depositing a nickel layer.

Next, as shown in FIG. 4B, the cap portion 20 is placed over the base portion 10 so that the metallic layer 6 overlaps the frame portion 2 of the base portion 10. This is heated as it is to 400° C., for instance, to thereby react silicon of the frame portion 2 with nickel of the metallic layer 6 and hence form an eutectic alloy. As a result, the base portion 10 and the cap portion 20 are bonded to each other such that the sensor portion 12 is sealed off between these two, and an acceleration sensor generally denoted at 101 is formed.

Since a bonding failure is created easily between the frame portion 2 and the metallic layer 6 in the acceleration sensor 101, there is a limit to an improvement in yield rate for manufacturing. In addition, such bonding failures deteriorate the reliability of the acceleration sensor 101.

An endeavor to identify a cause of this has led to a fact that phosphorus contained in polycrystalline silicon of the frame portion 2 diffuses and reaches the metallic layer 6 during heating and precipitates at a junction interface between silicon and nickel, and the precipitation causes an incomplete junction and a dorp in bonding strength.

SUMMARY OF THE INVENTION

Accordingly, the present invention aims at providing an acceleration sensor in which a frame portion of a base portion is favorably bonded to a metallic layer of a cap portion, and providing a method of manufacturing the same.

The present invention is directed to an acceleration sensor in which a base portion and a cap portion are bonded to each other and a sensor portion is sealed off between said base portion and said cap portion, comprising:

a) a base portion comprising: a semiconductor substrate; a sensor portion and a frame portion surrounding a periphery of said sensor portion, which are formed by a polycrystalline silicon layer deposited on said semiconductor substrate and doped with an impurity; and a diffusion preventing layer and a non-doped polycrystalline silicon layer which are stacked one atop the other on said frame portion; and b) a cap portion comprising: a base unit; and a nickel layer formed on said base unit so as to be in contact with said non-doped polycrystalline silicon layer of said base portion, wherein said non-doped polycrystalline silicon layer of said base portion and said nickel layer of said cap portion are bonded to each other by eutectic bonding, and said sensor portion is sealed off between said base portion and said cap portion.

Thus, forming the diffusion preventing layer, it is possible to prevent diffusion of the impurity from the frame portion to the eutectic bonding surface. As a result, it is possible to achieve excellent eutectic bonding, and hence, to improve a bonding strength.

The diffusion preventing layer is preferably a layer selected from a group of a silicon oxide layer and a silicon nitride layer.

This is for effectively preventing diffusion of the impurity into the non-doped polycrystalline silicon layer.

The present invention is also directed to an acceleration sensor in which a base portion and a cap portion are bonded to each other and a sensor portion is sealed off between said base portion and said cap portion, comprising:

a) a base portion comprising: a semiconductor substrate; a sensor portion and a frame portion surrounding a periphery of said sensor portion, which are formed by a polycrystalline silicon layer deposited on said semiconductor substrate and doped with an impurity; and a non-doped polycrystalline silicon layer with a predetermined film thickness stacked on said frame portion; and b) a cap portion comprising: a base unit; and a nickel layer formed on said base unit so as to be in contact with said non-doped polycrystalline silicon layer of said base portion, wherein said non-doped polycrystalline silicon layer of said base portion and said nickel layer of said cap portion are bonded to each other by eutectic bonding, and said sensor portion is sealed off between said base portion and said cap portion, and the film thickness of said non-doped polycrystalline silicon layer is larger than a distance over which the impurity contained in said frame portion diffuses in said non-doped polycrystalline silicon layer.

Thus, since the non-doped polycrystalline silicon layer has a predetermined film thickness, it is possible to prevent the impurity diffused from the frame portion from reaching the eutectic bonding surface. As a result, it is possible to enhance a bonding strength at the eutectic bonding surface.

The film thickness of said non-doped polycrystalline silicon layer is preferably within a range of 1 $\mu$m to 5 $\mu$m.

Such a film thickness makes it possible to effectively prevent the impurity from reaching the junction interface at the step of bonding the base portion and the cap portion.

It is preferable that the impurity is phosphorus.

The cap portion may include a titanium layer between said base unit and said nickel layer.

The present invention is further directed to a method of manufacturing an acceleration sensor in which a base portion and a cap portion are bonded to each other and a sensor portion is sealed off between said base portion and said cap portion, comprising the steps of: depositing a polycrystalline silicon layer doped with an impurity on a semiconductor substrate; processing said polycrystalline silicon layer, and forming a sensor portion and a frame portion surrounding a periphery of said sensor portion; stacking a diffusion preventing layer and a non-doped polycrystalline silicon layer one after another on said frame portion to thereby form a base portion; preparing a cap portion of a base unit comprising a nickel layer in a contacting area with said non-doped polycrystalline silicon layer of said base portion; placing said cap portion on said base portion so as to contact said nickel layer and said non-doped polycrystalline silicon layer to each other; and heating said base portion and said cap portion, bonding said non-doped polycrystalline silicon layer and said nickel layer to each other by eutectic bonding, and sealing off said sensor portion between said base portion and said cap portion.

Thus, forming the diffusion preventing layer, it is possible to prevent diffusion of the impurity from the frame portion to the eutectic bonding surface.

Preferably, said diffusion preventing layer is formed by a film selected from a group of a silicon oxide layer and a silicon nitride layer.

The present invention is still further directed to a method of manufacturing an acceleration sensor in which a base portion and a cap portion are bonded to each other and a sensor portion is sealed off between said base portion and said cap portion, comprising the steps of: depositing a polycrystalline silicon layer doped with an impurity on a semiconductor substrate; processing said polycrystalline silicon layer, and forming a sensor portion and a frame portion surrounding a periphery of said sensor portion; stacking a non-doped polycrystalline silicon layer with a predetermined film thickness on said frame portion to thereby form a base portion; preparing a cap portion of a base unit comprising a nickel layer in a contacting area with said non-doped polycrystalline silicon layer of said base portion; placing said cap portion on said base portion so as to contact said nickel layer and said non-doped polycrystalline silicon layer to each other; and heating said base portion and said cap portion, bonding said non-doped polycrystalline silicon layer and said nickel layer to each other by eutectic bonding, and sealing off said sensor portion between said base portion and said cap portion, wherein the film thickness of said non-doped polycrystalline silicon layer is larger than a distance over which the impurity contained in said frame portion diffuses in said non-doped polycrystalline silicon layer at the step of eutectic bonding.

Since the non-doped polycrystalline silicon layer has a predetermined film thickness, it is possible to prevent the impurity diffused from the frame portion from reaching the junction interface.

The film thickness of said non-doped polycrystalline silicon layer is preferably within a range of 1 $\mu$m to 5 $\mu$m.

Such a film thickness makes it possible to effectively prevent the impurity from reaching the junction interface at the step of bonding the base portion and the cap portion.

It is preferable that the impurity is phosphorus.

The cap portion may include a titanium layer between said base unit and said nickel layer.

As described clearly above, it is possible to prevent the impurity from diffusing and reaching the junction interface between the base portion and the cap portion, and hence, to achieve excellent eutectic bonding, in the acceleration sensors according to the present invention.

In consequence, a yield rate for manufacturing the acceleration sensors improves.

Further, it is possible to improve the reliability of the acceleration sensors.

BRIEF DESCRIPTION OF THE DRAWINGS

FIG. 3 is a top view of the base portion in the conventional acceleration sensor.

FIGS. 4A and 4B are cross sectional views of the conventional acceleration sensor.

DETAILED DESCRIPTION OF THE PREFERRED EMBODIMENTS

First Embodiment

Figure 1A:
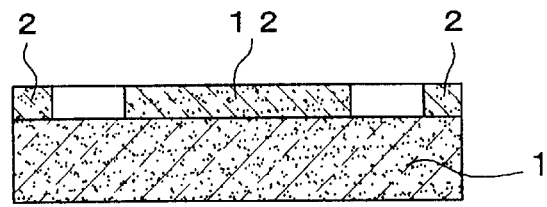
FIGS. 1A–1C are cross sectional views of the acceleration sensor according to the first embodiment.
Figure 1B:
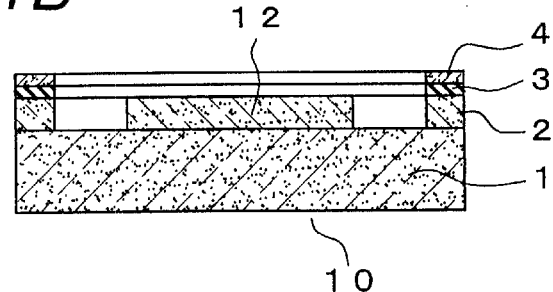
Figure 1C:
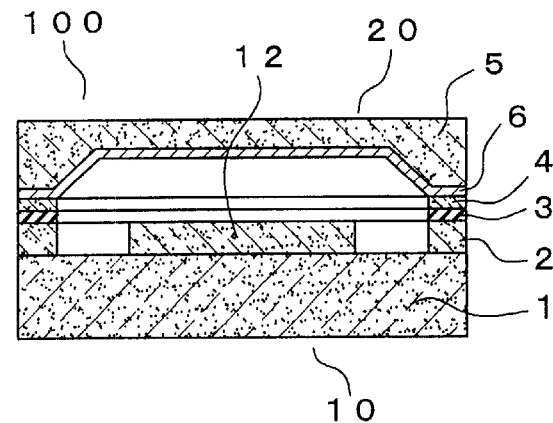

FIGS. 1A–1C are cross sectional views showing steps of manufacturing an acceleration sensor according to a first embodiment.

At these production steps, first, as shown in FIG. 1A, a polycrystalline silicon layer is deposited on a semiconductor substrate 1 of silicon and selectively removed, thereby forming a sensor portion 12 and a frame portion 2 surrounding the sensor portion 12. In the sensor portion 12, an acceleration sensor element (not shown) is formed. This step is the same as in conventional production for manufacturing an acceleration sensor.

Next, as shown in FIG. 1B, a diffusion preventing layer 3 is deposited on the semiconductor substrate 1 so as to coat the sensor portion 12 and the frame portion 2. As the diffusion preventing layer 3, silicon oxide or silicon nitride may be used, or alternatively, metal such as aluminum and gold may be used.

Next, a non-doped polycrystalline silicon layer 4 is formed to cover the diffusion preventing layer 3.

Next, using a conventional lithographic technique and an etching technique, the non-doped polycrystalline silicon layer 4 and the diffusion preventing layer 3 are removed selectively so as to leave only these two in a top portion of the frame portion 2.

Next, as shown in FIG. 1C, a cap portion 20 is placed on the base portion 10. The cap portion 20 is formed similarly to the conventional step shown in FIG. 4A. Thus, using a sputtering method, for instance, a titanium layer is formed on a surface including a concave portion of a cap main unit (base unit) 5 of silicon, and further, a nickel layer is formed on the titanium layer. With the cap portion 20 placed over the base portion 10, the non-doped polycrystalline silicon layer 4 formed on the frame portion 2 contacts the nickel layer of the metallic layer 6.

Next, this is heated as it is in a heating furnace to an eutectic temperature of silicon and nickel, preferably, a temperature between about 350° C. and about 450° C., and more preferably, about 400° C. A heating time is from about scores of minutes to about a few hours. During heating, the heating furnace may be kept vacuum, or alternatively, may contain inert gas such as nitrogen.

In this manner, heating causes silicon contained in the polycrystalline silicon layer 4 and nickel contained in the metallic layer 6 to form an eutectic alloy, so that the base portion 10 and the cap portion 20 are bonded to each other. This completes an acceleration sensor 100 in which a sensor element is sealed off.

According to the first embodiment, since the diffusion preventing layer 3 is formed on the frame portion 2, at the heating step described above, phosphorus is prevented from diffusing from the frame portion 2 into the non-doped polycrystalline silicon layer 4.

In consequence, excellent eutectic bonding is obtained without allowing precipitation of phosphorus at the junction interface between the non-doped polycrystalline silicon layer 4 and the metallic layer 6.

Second Embodiment

Figure 2:
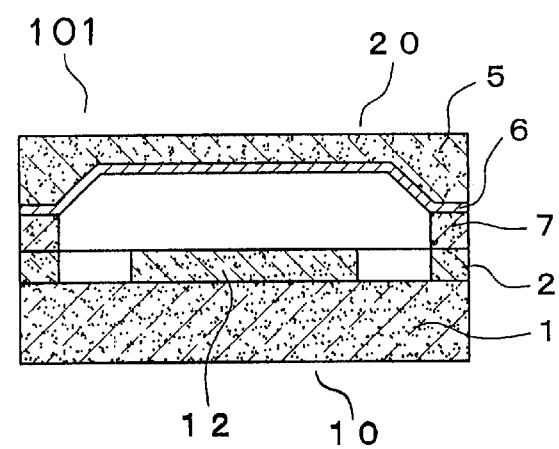
FIG. 2 is a cross sectional view of the acceleration sensor according to the second embodiment.

FIG. 2 is a cross sectional view of an acceleration sensor 101 according to a second embodiment. In the acceleration sensor 101 shown in FIG. 2, a non-doped polycrystalline silicon layer 7 with a predetermined film thickness is disposed instead of the diffusion preventing layer 3 and the non-doped polycrystalline silicon layer 4 of the acceleration sensor 100 shown in FIG. 1C. The film thickness of the non-doped polycrystalline silicon layer 7 is preferably about from 1 $\mu$m to 5 $\mu$m, for example. Other structures are the same as in the acceleration sensor 100.

In the acceleration sensor 101 according to the second embodiment, the film thickness of the non-doped polycrystalline silicon layer 7 is a predetermined thickness. Hence, at the heating step, even if phosphorus diffuses from the frame portion 2 into the non-doped polycrystalline silicon layer 7, phosphorus does not reach the junction interface between the non-doped polycrystalline silicon layer 7 and the metallic layer 6.

Hence, it is possible to obtain excellent eutectic bonding without allowing precipitation of phosphorus at the junction interface between the non-doped polycrystalline silicon layer 4 and the metallic layer 6.

It is confirmed, according to a result of experiments by the inventors, that phosphorus does not reach the junction interface if the film thickness is at least even 1 $\mu$m thicker with the heating condition above.

The film thickness of the non-doped polycrystalline silicon layer 7 may be changed in accordance with a heating temperature and a heating time at the heating step.

While the first and the second embodiments relate to an example that phosphorus doped the frame portion 2 diffuses, the present invention is also applicable to where other dopant, such as boron, gallium and arsenic, is used. In such a case, in the acceleration sensor 101 according to the second embodiment, the film thickness of the non-doped polycrystalline silicon layer 7 is adjusted depending on the type of the dopant.

What is claimed is:

1. An acceleration sensor in which a base portion and a cap portion are bonded to each other and a sensor portion is sealed off between said base portion and said cap portion, comprising:
   a) a base portion comprising:
      a semiconductor substrate;
      a sensor portion and a frame portion surrounding a periphery of said sensor portion, which are formed by a polycrystalline silicon layer deposited on said semiconductor substrate and doped with an impurity; and
      a diffusion preventing layer and a non-doped polycrystalline silicon layer which are stacked one atop the other on said frame portion; and
   b) a cap portion comprising:
      a base unit; and
      a nickel layer formed on said base unit so as to be in contact with said non-doped polycrystalline silicon layer of said base portion,
      wherein said non-doped polycrystalline silicon layer of said base portion and said nickel layer of said cap portion are bonded to each other by eutectic bonding, and said sensor portion is sealed off between said base portion and said cap portion.

2. The acceleration sensor according to claim 1, wherein said diffusion preventing layer is a layer selected from a group of a silicon oxide layer and a silicon nitride layer.

3. The acceleration sensor according to claim 1, wherein the impurity is phosphorus.

4. The acceleration sensor according to claim 1, wherein said cap portion includes a titanium layer between said base unit and said nickel layer.

5. An acceleration sensor in which a base portion and a cap portion are bonded to each other and a sensor portion is sealed off between said base portion and said cap portion, comprising:
   a) a base portion comprising:
      a semiconductor substrate;
      a sensor portion and a frame portion surrounding a periphery of said sensor portion, which are formed by a polycrystalline silicon layer deposited on said semiconductor substrate and doped with an impurity; and
      a non-doped polycrystalline silicon layer with a predetermined film thickness stacked on said frame portion; and
   b) a cap portion comprising:
      a base unit; and
      a nickel layer formed on said base unit so as to be in contact with said non-doped polycrystalline silicon layer of said base portion,
      wherein said non-doped polycrystalline silicon layer of said base portion and said nickel layer of said cap portion are bonded to each other by eutectic bonding, and said sensor portion is sealed off between said base portion and said cap portion, and
      the film thickness of said non-doped polycrystalline silicon layer is larger than a distance over which the impurity contained in said frame portion diffuses in said non-doped polycrystalline silicon layer.

6. The acceleration sensor according to claim 5, wherein the film thickness of said non-doped polycrystalline silicon layer is within a range of 1 $\mu$m to 5 $\mu$m.

7. The acceleration sensor according to claim 5, wherein the impurity is phosphorus.

8. The acceleration sensor according to claim 5, wherein said cap portion includes a titanium layer between said base unit and said nickel layer.

9. A method of manufacturing an acceleration sensor in which a base portion and a cap portion are bonded to each other and a sensor portion is sealed off between said base portion and said cap portion, comprising the steps of:
   depositing a polycrystalline silicon layer doped with an impurity on a semiconductor substrate;
   processing said polycrystalline silicon layer, and forming a sensor portion and a frame portion surrounding a periphery of said sensor portion;
   stacking a diffusion preventing layer and a non-doped polycrystalline silicon layer one after another on said frame portion to thereby form a base portion;
   preparing a cap portion of a base unit comprising a nickel layer in a contacting area with said non-doped polycrystalline silicon layer of said base portion;
   placing said cap portion on said base portion so as to contact said nickel layer and said non-doped polycrystalline silicon layer to each other; and
   heating said base portion and said cap portion, bonding said non-doped polycrystalline silicon layer and said nickel layer to each other by eutectic bonding, and sealing off said sensor portion between said base portion and said cap portion.

10. The method of manufacturing according to claim 9, wherein said diffusion preventing layer is formed by a film selected from a group of a silicon oxide layer and a silicon nitride layer.

11. The method of manufacturing according to claim 9, wherein the impurity is phosphorus.

12. The method of manufacturing according to claim 9, wherein said cap portion includes a titanium layer between said base unit and said nickel layer.

13. A method of manufacturing an acceleration sensor in which a base portion and a cap portion are bonded to each other and a sensor portion is sealed off between said base portion and said cap portion, comprising the steps of:

depositing a polycrystalline silicon layer doped with an impurity on a semiconductor substrate;

processing said polycrystalline silicon layer, and forming a sensor portion and a frame portion surrounding a periphery of said sensor portion;

stacking a non-doped polycrystalline silicon layer with a predetermined film thickness on said frame portion to thereby form a base portion;

preparing a cap portion of a base unit comprising a nickel layer in a contacting area with said non-doped polycrystalline silicon layer of said base portion;

placing said cap portion on said base portion so as to contact said nickel layer and said non-doped polycrystalline silicon layer to each other; and heating said base portion and said cap portion, bonding said non-doped polycrystalline silicon layer and said nickel layer to each other by eutectic bonding, and sealing off said sensor portion between said base portion and said cap portion, wherein the film thickness of said non-doped polycrystalline silicon layer is larger than a distance over which the impurity contained in said frame portion diffuses in said non-doped polycrystalline silicon layer at the step of eutectic bonding.

14. The method of manufacturing according to claim 13, wherein the film thickness of said non-doped polycrystalline silicon layer is within a range of 1 $\mu$m to 5 $\mu$m.

15. The method of manufacturing according to claim 13, wherein the impurity is phosphorus.

16. The method of manufacturing according to claim 13, wherein said cap portion includes a titanium layer between said base unit and said nickel layer.

* * * * *